(12) United States Patent
Andou (10) Patent No.: US 8,310,049 B2
(45) Date of Patent: Nov. 13, 2012

(54) SEMICONDUCTOR DEVICE HAVING LEAD FREE SOLDERS BETWEEN SEMICONDUCTOR CHIP AND FRAME AND FABRICATION METHOD THEREOF

(75) Inventor: Hideko Andou, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 283 days.

(21) Appl. No.: 12/654,245

(22) Filed: Dec. 15, 2009

(65) Prior Publication Data

US 2010/0181666 A1 Jul. 22, 2010

(30) Foreign Application Priority Data

Jan. 16, 2009 (JP) ................................ 2009-007793

(51) Int. Cl.
*H01L 23/498* (2006.01)
(52) U.S. Cl. ................................. 257/737; 257/E21.511
(58) Field of Classification Search .......... 257/737–739, 257/784–786, 691–692, 724, 725
See application file for complete search history.

(56) References Cited

U.S. PATENT DOCUMENTS

| 5,426,263 | A * | 6/1995 | Potter et al. ................. | 174/558 |
| 6,777,800 | B2 * | 8/2004 | Madrid et al. ................ | 257/690 |
| 7,045,884 | B2 * | 5/2006 | Standing ....................... | 257/678 |
| 7,364,949 | B2 * | 4/2008 | Standing ....................... | 438/121 |
| 7,541,681 | B2 * | 6/2009 | Otremba ....................... | 257/781 |
| 7,757,392 | B2 * | 7/2010 | Otremba ....................... | 29/840 |
| 2004/0061221 | A1 * | 4/2004 | Schaffer ........................ | 257/723 |
| 2005/0121784 | A1 * | 6/2005 | Standing ....................... | 257/737 |
| 2006/0012038 | A1 * | 1/2006 | Miyazaki et al. .............. | 257/737 |
| 2006/0017174 | A1 * | 1/2006 | Otremba ....................... | 257/778 |
| 2006/0049519 | A1 * | 3/2006 | Otsuki .......................... | 257/737 |
| 2006/0091523 | A1 * | 5/2006 | Shimanuki .................... | 257/698 |
| 2007/0259514 | A1 * | 11/2007 | Otremba ....................... | 438/612 |
| 2008/0036083 | A1 | 2/2008 | Sawada et al. | |

FOREIGN PATENT DOCUMENTS

| JP | 2005-340268 | 12/2005 |
| JP | 2008-28135 | 2/2008 |
| JP | 2008-42077 | 2/2008 |

* cited by examiner

*Primary Examiner* — Nathan Ha
(74) *Attorney, Agent, or Firm* — McGinn IP Law Group, PLLC (57) ABSTRACT

A semiconductor device includes a semiconductor chip having a current path between a first principal surface and a second principal surface opposite from the first principal surface, a first conductive frame having an opposite region to the first principal surface, and a second conductive frame electrically connected via electrical connection member to a pad formed on the second principal surface. In a gap between the first principal surface and the first conductive frame, there are arranged multiple column-shaped lead-free solders which are arranged within a circle drawn around a center of the opposite region and having a diameter corresponding to a narrow side of the opposite region, and which electrically connects the first conductive frame with the semiconductor chip, and a filler which is filled between the multiple column-shaped lead-free solders.

11 Claims, 11 Drawing Sheets

SEMICONDUCTOR DEVICE HAVING LEAD FREE SOLDERS BETWEEN SEMICONDUCTOR CHIP AND FRAME AND FABRICATION METHOD THEREOF

INCORPORATION BY REFERENCE

This application is based upon and claims the benefit of priority from Japanese Patent Application No. 2009-007793 which was filed on Jan. 16, 2009, the disclosure of which is incorporated herein in its entirety by reference.

BACKGROUND OF THE INVENTION

1. Field of the Invention

The present invention relates to a semiconductor device and fabrication method thereof.

2. Description of Related Art

In mounting a semiconductor chip on a package substrate or lead frame, a method is typically used which connects a surface (rear surface) on the side opposite from a surface (front surface) of the semiconductor chip element with the package substrate or lead frame by use of a mounting material. On the other hand, for CPU (Central Processing Unit) and the like particularly requiring a multiple-pin structure, miniaturization and slim structure, a flip chip mounting method is also used in which the front surface of a semiconductor chip, facing a package substrate or lead frame, is connected via projection-shaped bumps called "bump" with the package substrate or lead frame (for example, Patent Documents 1 and 2).

In the flip chip mounting method, solder bump or Au bump is used. Particularly, in a CPU for personal computer, high-melting lead solder bump is sometimes used. The reason for this is that, when a customer mounts the substrate, the solder of the flip chip mounting section is prevented from melting. In recent years, from a viewpoint of reducing environmental burden, there is increasing demand for lead-free (Pb-free) solder. However, an alternative cannot be supplied in the immediate future, so the bump of the flip chip mounting section is presently excepted from a list of lead-free soldering objects.

Similarly, high-melting lead solder is often used as a mounting material used to mount on a lead frame a semiconductor chip such as MOSFET (Metal Oxide Semiconductor Field Effect Transistor) requiring low on-resistance, low thermal resistance, high reliability and the like. High-melting lead solder has excellent characteristics that excellent ductility is provided and thermal stress caused by temperature variation can be readily absorbed. Further, when a customer mounts the substrate, melting does not occur in a reflow process or the like, so high reliability is provided. Similarly to the high-melting lead solder bump for the flip chip mounting method, the mounting material for these semiconductor chips are also excepted from a list of lead-free soldering objects. However, from a viewpoint of reducing environmental burden, the customer's demand for lead-free solder used as the mounting material for a semiconductor chip has recently been rising.

Presently, conductive paste including silver flakes (Ag paste) is a lead-free material having a highest possibility of being used as the chip mounting material. However, Ag paste has an electrical resistivity three to five times greater than lead solder. Thus, it is difficult to use Ag paste in a product requiring low on-resistance.

Figure 12A:
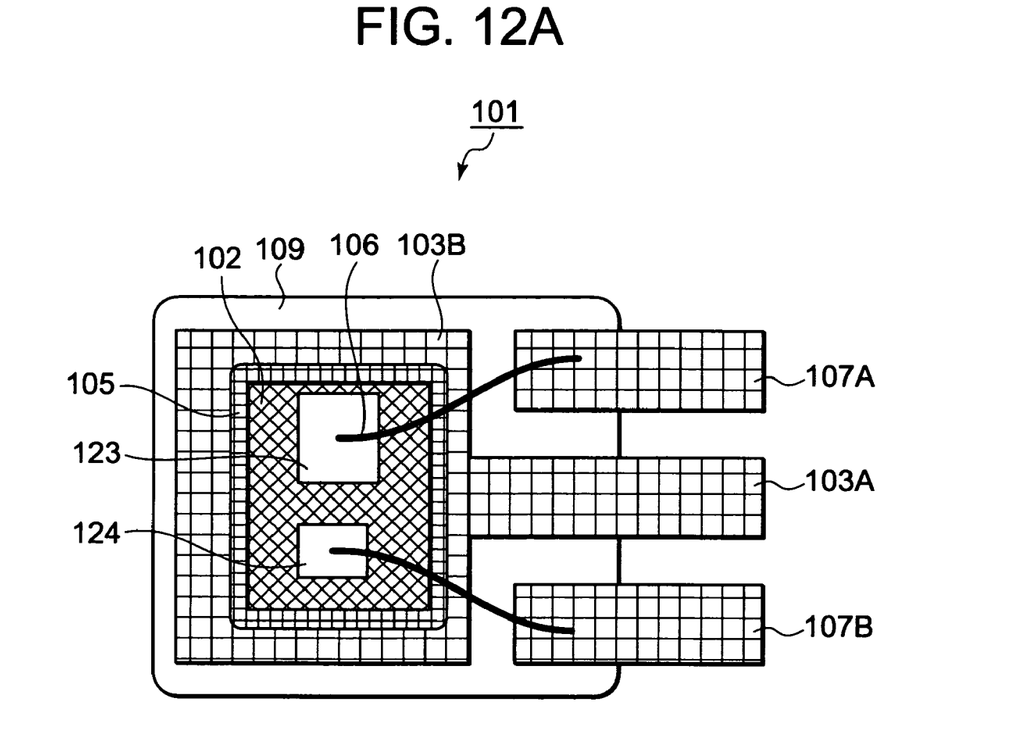
FIG. 12A is a schematic top view of a semiconductor device according to Patent Document 3.
Figure 12B:
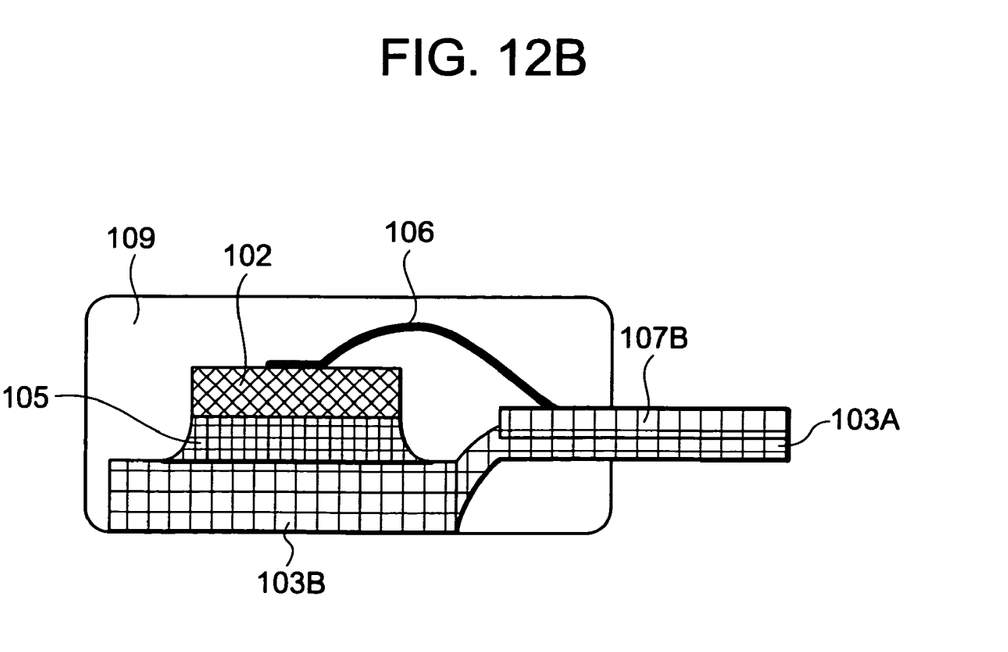
FIG. 12B is a schematic side view of the semiconductor device according to Patent Document 3.

Accordingly, as a result of diligent study on alternative lead-free material other than Ag paste, several proposals have been made (for example, Patent Document 3). FIG. 12A illustrates a top view of a structure of a transistor package described in Patent Document 3 as seen through encapsulating resin; and FIG. 12B illustrates a side view as seen through the encapsulating resin. In a semiconductor device 101, a semiconductor chip 102 is joined to the whole surface of a header 103B of a drain lead 103A with a lead-free solder 105 of the SnSbAgCu family having a solid phase temperature of 228° C., and a source electrode 123 and gate electrode 124 of the semiconductor chip 102 are connected via an aluminum wire 106 to a source lead 107A and gate lead 107B each being an external connection terminal. These parts are molded with an encapsulating resin 109. Here, a header 103B is exposed on the bottom surface of the semiconductor device 101, so the semiconductor device 101 can be connected to a wiring substrate.

[Patent Document 1] Japanese Patent Laid-Open No. 2008-28135

[Patent Document 2] Japanese Patent Laid-Open No. 2008-42077

[Patent Document 3] Japanese Patent Laid-Open No. 2005-340268

SUMMARY

According to Patent Document 3, with the encapsulating resin 109 of low thermal expansion used for molding the device, when the lead-free solder 105 lower than 260° C. being a reflow temperature is used, also, a transistor package having a reflow tolerance of 260° C. can be provided; and when the lead-free solder 105 having a hardness of Hv 40 to 60 is used, the thermal fatigue life of the solder junction can be significantly improved. However, the hardness of Hv 40 to 60 is much higher, compared to Hv 11 of lead solder (Pb-63Sn), so there is a need for a material having a higher reliability.

Presently, as a mounting material used to mount on a lead frame, a semiconductor chip such as MOSFET requiring low on-resistance, low thermal resistance, high reliability and the like, an alternative to lead solder has been diligently studied. However, there are drawbacks in terms of thermal conductivity, melting point and stiffness, so no material suitable for this purpose has been discovered. Under these circumstances, there is strong need for a technique which can implement high reliability while using lead-free solder.

A semiconductor device according to an exemplary aspect of the present invention includes a semiconductor chip having a current path between a first principal surface and a second principal surface on the side opposite from the first principal surface, a first conductive frame having an opposite region to the first principal surface, a second conductive frame electrically connected via electrical connection member to a pad formed on the second principal surface, a plurality of column-shaped lead-free solders which are arranged in a gap between the first principal surface and the first conductive frame and within a circle drawn around a center of the opposite region and having a diameter corresponding to a narrow side of the opposite region, and which electrically connects the first conductive frame with the semiconductor chip, and a filler which is filled between the plurality of column-shaped lead-free solders.

As a material for connecting the first conductive frame with a MOSFET chip (semiconductor chip) requiring low on-resistance, low thermal resistance and high reliability, lead solder has hitherto been used as described above. Lead solder is uniformly arranged over the whole surface in the gap between the first principal surface and the semiconductor chip, and is electrically connected to these parts and firmly fixed. In Patent Document 3, a method is proposed in which lead solder is replaced with lead-free solder while using the similar structure, and encapsulating resin of a low expansion coefficient is used to mold the device. In this case, there is no need to apply different potentials according to the parts in performing electrical connection for the gap between the first conductive frame and the semiconductor chip; this is different from a case where the semiconductor chip is, as in Patent Documents 1 and 2, flip-chip mounted on a wiring substrate. Consequently, the method has hitherto been used which forms a solder material over the whole surface of the gap between the first conductive frame and the semiconductor chip.

The solder arranged in the gap between the first conductive frame and the semiconductor chip is not uniformly formed over the whole surface but formed into a shape of multiple columns. The filler is filled between these column-shaped lead-free solders. Further, the position of arranging the lead-free solders is adjusted. Accordingly, when lead-free solder having a Young's modulus five times higher than related-art lead solder is used as a chip mounting material, also, stress occurring between the semiconductor chip and the first conductive frame can be reduced using the filler. As a result, it is possible to effectively suppress occurrence of cracks in the lead-free solder and breakage of the semiconductor chip.

The present invention has excellent advantages that a semiconductor device having high reliability can be provided while environmental burden is reduced by use of lead-free solder.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
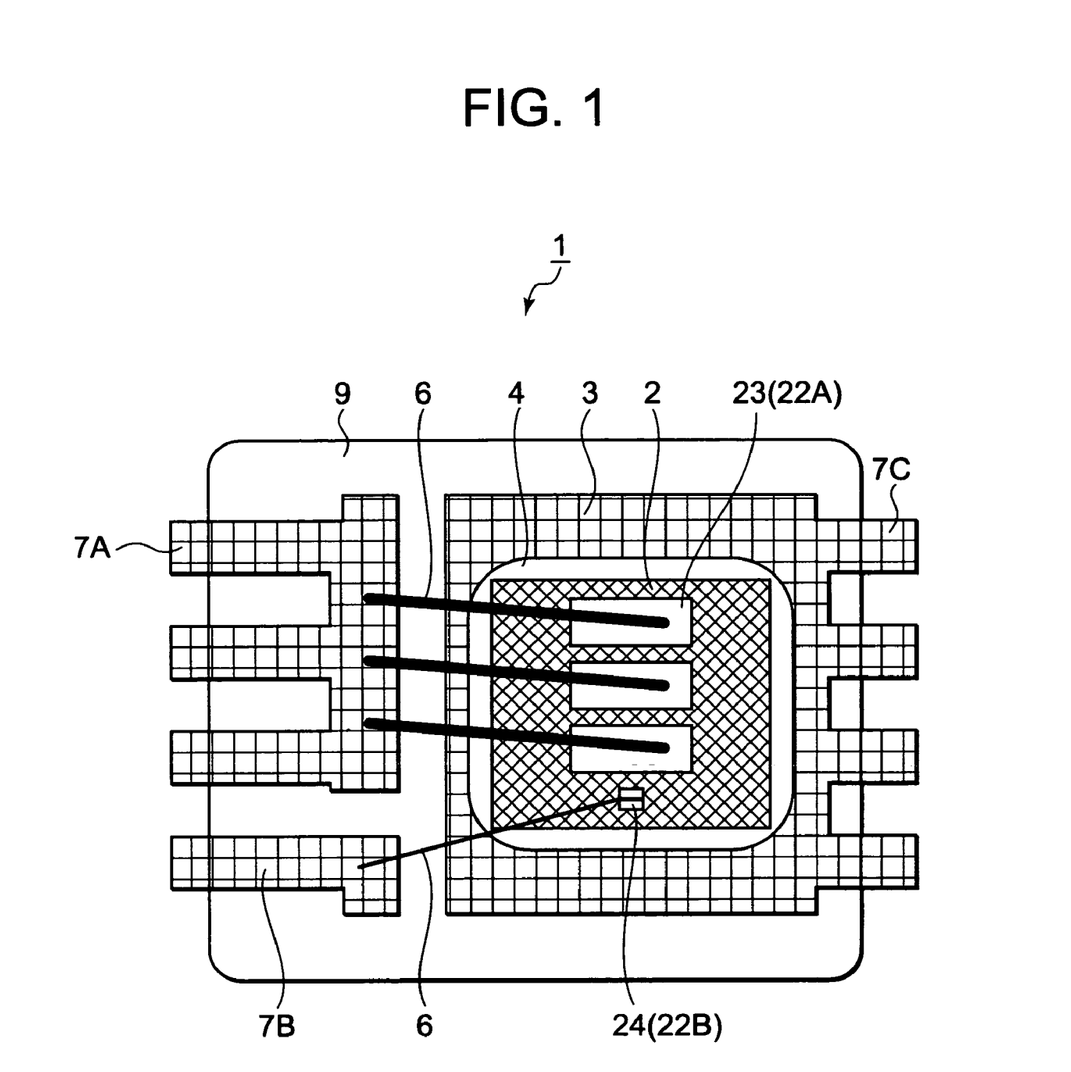
FIG. 1 is a schematic top view of a semiconductor device according to an exemplary embodiment 1.
Figure 2A:
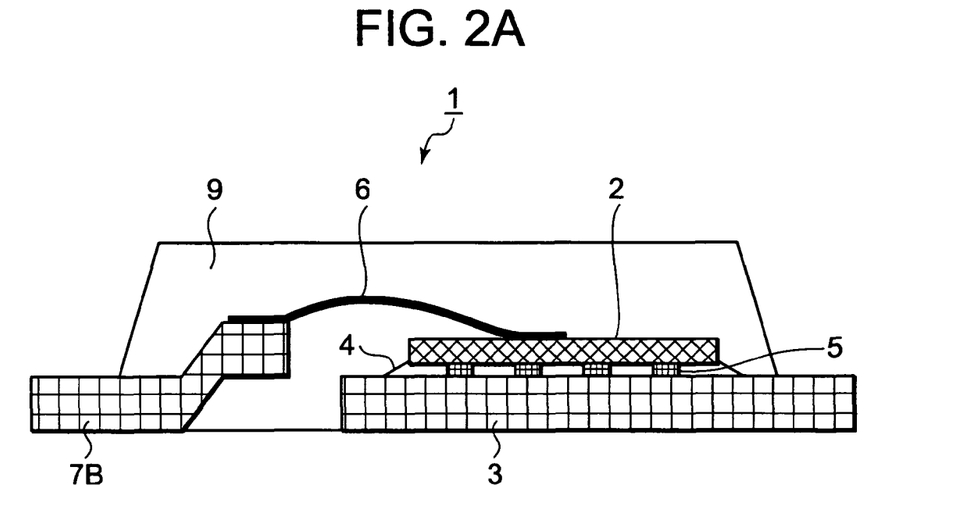
FIG. 2A is a schematic side view of the semiconductor device according to the exemplary embodiment 1.
Figure 2B:
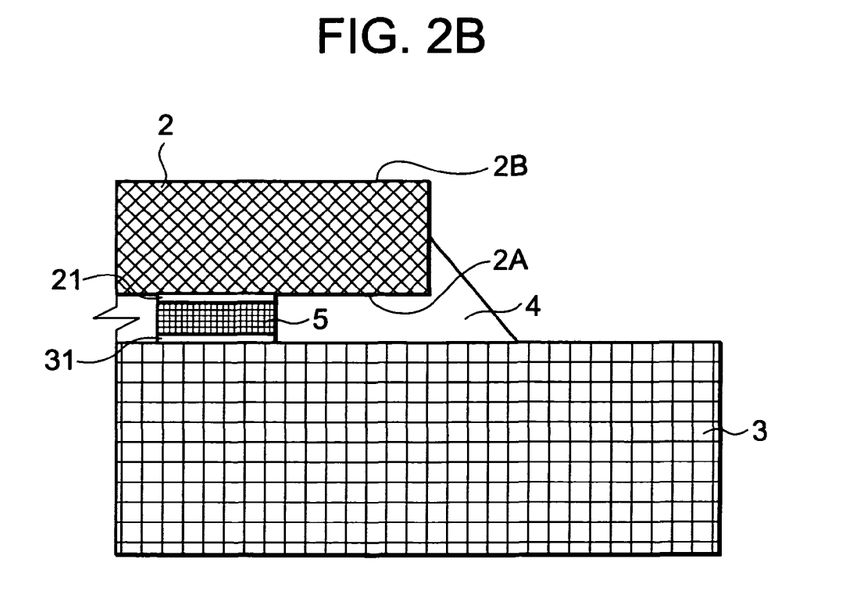
FIG. 2B is a partially enlarged side view of FIG. 2A.

FIG. 1 illustrates a top view of a semiconductor device according to the exemplary embodiment 1 as seen through encapsulating resin; FIG. 2 illustrates a schematic side view of the semiconductor device according to the exemplary embodiment 1 as seen through the encapsulating resin; and FIG. 2B is a partially enlarged sectional view of FIG. 2A. The semiconductor device 1 is a transistor package and includes a semiconductor chip 2, die pad 3 being a first conductive frame, underfill resin 4 being a filler, lead-free solder 5, aluminum wire 6 being electrical connection means, source lead 7A being a second conductive frame, gate lead 7B being a second conductive frame, and encapsulating resin 9.

The semiconductor chip 2 is MOSFET, i.e., a transistor chip. The semiconductor chip 2 includes a first principal surface 2A having a region opposite the die pad 3 being the first conductive frame and a second principal surface 2B being a principal surface on the side opposite from the first principal surface 2A (refer to FIG. 2B). A conductive pattern 21 composed of a metal layer is formed on the first principal surface 2A. A source pad 22A functioning as a source electrode 23 and a gate pad 22B functioning as a gate electrode 24 are formed on the second principal surface 2B (refer to FIG. 1). The source pad 22A functions as a pad connected to a current path between the first principal surface 2A and the second principal surface 2B. The pad is one of the multiple pads formed on the second principal surface 2B. A conductive pattern 31 is formed by plating, and formed on a surface of the die pad 3 opposite the semiconductor chip 2.

The semiconductor device 1 is constituted of the die pad 3 and the semiconductor chip 2 electrically connected via the lead-free solder 5. More specifically, the lead-free solder 5 is sandwiched between the conductive pattern 31 formed by plating in a predetermined position on the surface of the die pad 3 and the conductive pattern 21 composed of a metal layer formed on the first principal surface of the semiconductor chip 2. The lead-free solder 5 is, as indicated by this name, a material composed of lead-free solder substantively containing no lead. Examples include Bi-2.5Ag, Bi—Sn—Cu family, Zn-6Al-5Ge, Zn-4Al-3Mg-3Ge, Sn—Ag, Sn—Ag—Cu, Sn—Bi, Sn—Zn and Sn—Zn—Bi. The above description is about an example in which the conductive pattern 21 is composed of a metal layer, but a metal layer does not always have to be used provided that conductivity is provided without departing from the object of the present invention.

The source electrode 23 (source pad 22A) of the semiconductor chip 2 is connected via the aluminum wire 6 to a source lead 7A being an external connection terminal. Similarly, the gate electrode 24 (gate pad 22B) of the semiconductor chip 2 is connected via the aluminum wire 6 to a gate lead 7B being an external connection terminal. The die pad 3, a part of a drain lead 7C which is connected to the die pad 3, a part of the source lead 7A, a part of the gate lead 7B, and the semiconductor chip 2 are, as illustrated in FIGS. 1 and 2, molded with the encapsulating resin 9. As the encapsulating resin 9, for example, epoxy resin or the like may be used.

Figure 3A:
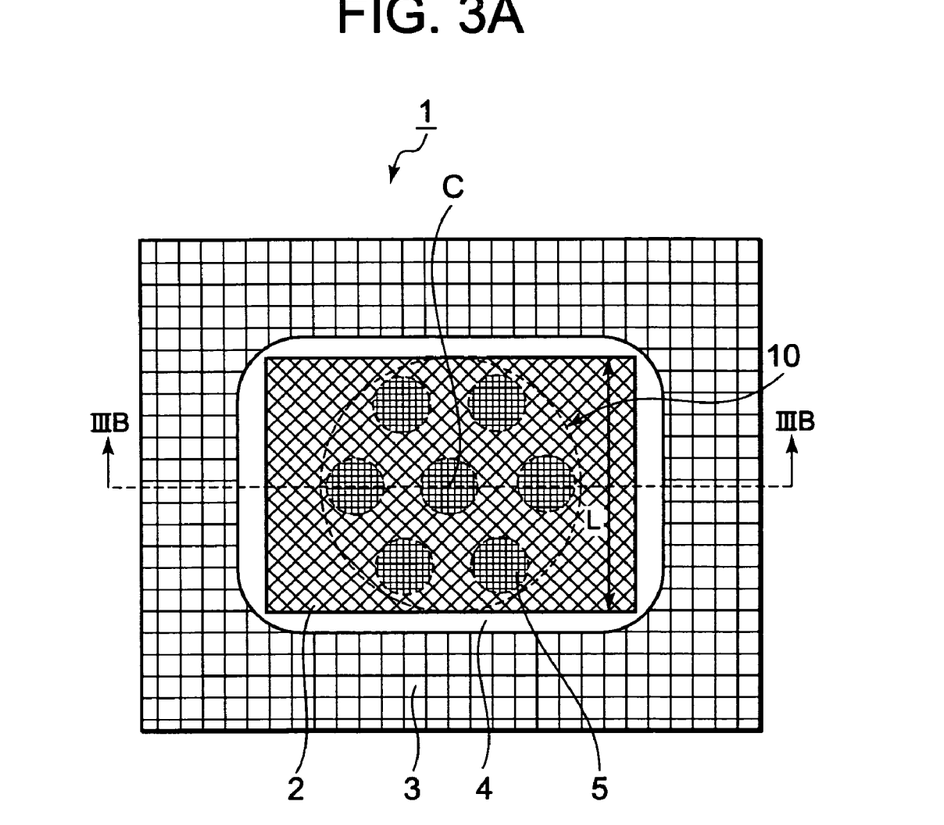
FIG. 3A is a schematic top view for describing a position of arranging lead-free solder according to the exemplary embodiment 1.
Figure 3B:
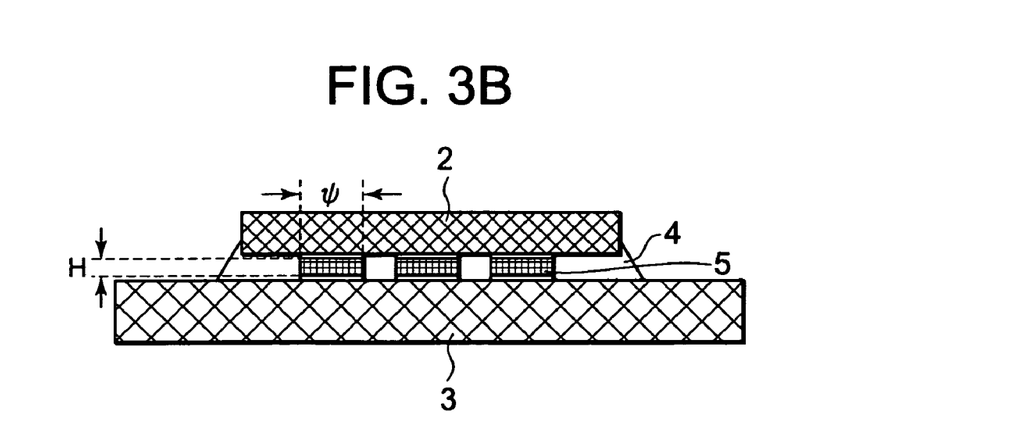
FIG. 3B is a sectional view along the line IIIB-IIIB of FIG. 3A.

FIG. 3A is a schematic top view for describing the shape and the arrangement position of the lead-free solder 5 arranged in the semiconductor chip 2 according to the exemplary embodiment 1. FIG. 3B is a sectional view along the line IIIB-IIIB of FIG. 3A. In FIG. 3, an illustration of the source pad 22A and gate pad 22B formed on the second principal surface 2B of the semiconductor chip 2 is omitted.

As illustrated in FIG. 3B, a plurality of the lead-free solders 5 column-shaped are arranged in a gap between the semiconductor chip 2 and the die pad 3 in a manner distant from each other. The space between the multiple lead-free solders 5 is filled with the underfill resin 4. Further, the lead-free solder 5 is, as illustrated in FIG. 3A, arranged within a circle 10 drawn around a center C of the opposite region between the semiconductor chip 2 and the die pad 3 and having a diameter corresponding to a narrow side L of the opposite region.

The underfill resin 4 is not particularly limited thereto, provided that the object of the present invention is achieved; but preferably, a material having a thermal expansion coefficient substantially equal to that of lead-free solder is used. Examples of the underfill resin 4 include epoxy resin and acryl resin. When the space between the lead-free solders 5 is filled with the underfill resin 4, stress occurring between the semiconductor chip 2 and the die pad 3 can be reduced, effectively preventing occurrence of cracks in the column-shaped lead-free solder 5.

In the exemplary embodiment 1, a case has been described in which seven column-shaped lead-free solders 5 are arranged within the circle 10; but this is exemplary of the present invention and the number of the lead-free solders 5 may be two or more and set appropriately. In other words, the number of column-shaped lead-free solders 5 arranged within the circle 10 may be set according to the size of the circle 10 drawn around the center C of the opposite region between the semiconductor chip 2 and the die pad 3 and having a diameter corresponding to the narrow side L of the opposite region, i.e., according to the size of the opposite region between the semiconductor chip 2 and the die pad 3, or according to the performance and application required.

The columnar shape of the lead-free solder 5 may be of circular column or of multangular column such as rectangular column. The diameter φ of the columnar shape is not particularly limited in a scope not departing from the object of the present invention; but, for example, from a viewpoint of the fabrication cost of a metal mask, the diameter of the columnar shape is preferably 100 μm or more. The height H of the lead-free solder 5 is not particularly limited in a scope not departing from the object of the present invention, but may be set to 20 to 50 μm, for example.

The method of fabricating the semiconductor device according to the exemplary embodiment 1 will be described with reference to FIGS. 4 and 5. FIGS. 4A to 4F and FIGS. 5G and 5J are substantial sectional views schematically illustrating steps of fabricating the semiconductor device according to the exemplary embodiment 1.

Figure 4A:
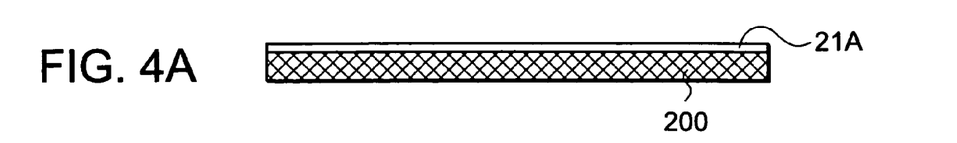
FIGS. 4A to 4F are sectional views illustrating steps of fabricating the semiconductor device according to the exemplary embodiment 1.

Firstly a wafer 200 is fabricated in which multiple semiconductor chips 2 are formed. Then, a metal layer 21A for forming the conductive pattern 21 on the first principal surface 2A of the semiconductor chip 2 is formed (FIG. 4A). As the metal layer 21A, Ti, Ni, Ag or the like may be appropriately used. The material of the conductive pattern 21 is not limited to a metal layer, and a conductive layer other than metal may be used in a scope not departing from the object of the present invention.

Figure 4B:
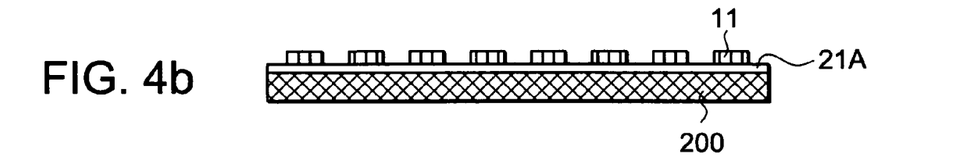
Figure 4C:
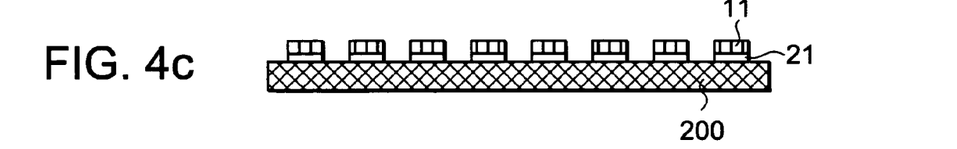

Subsequently, resist is applied onto the metal layer. Then, a resist pattern 11 of a desired shape is formed by photolithography (FIG. 4B). Then, the metal layer 21A exposed is etched and removed by using the resist pattern 11 as a mask, whereby the conductive pattern 21 is provided (FIG. 4C). Then, the resist pattern 11 is removed.

Figure 4D:
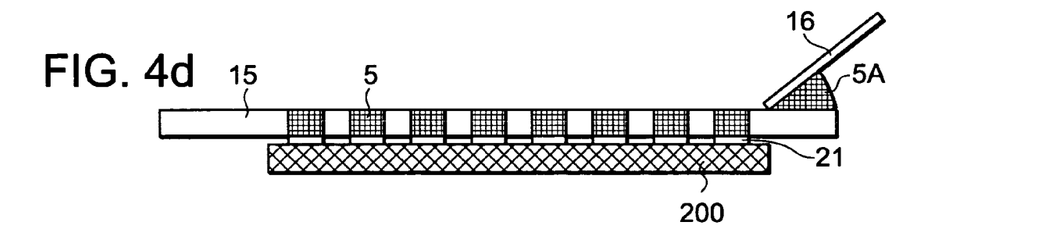
Figure 4E:
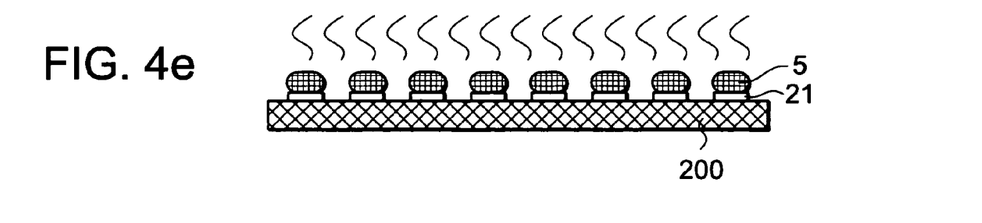

Subsequently, the lead-free solder 5 is fed onto the first principal surface 2A of the semiconductor chip 2. More specifically, a metal mask 15 preliminarily shaped into a desired pattern is placed on the first principal surface 2A, and a lead-free solder paste 5A is fed to the metal mask 15 and solder printing is performed using a squeegee 16 or the like (FIG. 4D). When the metal mask 15 is used which has been patterned so that the lead-free solder paste 5A is fed within the circle 10 drawn around the center C of the opposite region between the first principal surface 2A and the die pad 3 and having a diameter corresponding to the narrow side L of the opposite region, the position of the column-shaped lead-free solder 5 can be easily adjusted.

Figure 4F:
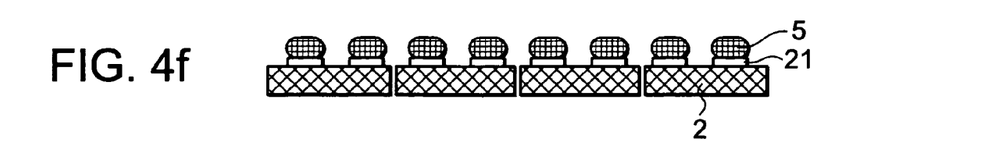

Thereafter, a reflow process is performed (FIG. 4E), and after cleansing, the wafer 200 is separated by dicing so that the size of the semiconductor chip 2 is provided (FIG. 4F). Here, instead of solder printing, a method may be used in which solder balls are fed and a reflow and cleansing process is performed. In this case, since solder balls are used, a variation in volume of the lead-free solder column can be more accurately controlled.

Figure 5G:
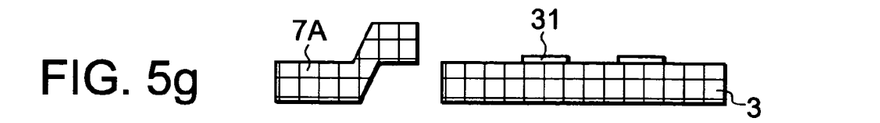
FIGS. 5G to 5J are sectional views illustrating steps of fabricating the semiconductor device according to the exemplary embodiment 1.
Figure 5H:
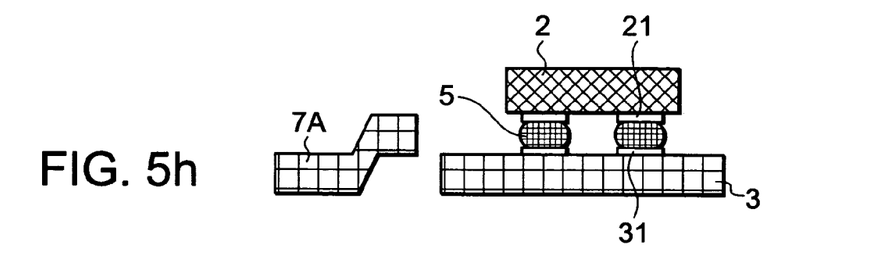

The conductive pattern 31 is preliminarily formed by plating on the surface of the die pad 3 (FIG. 5G). Ag plating may be applied to the conductive pattern 31, for example. Positioning of the lead-free solder 5 formed on the semiconductor chip 2 and the conductive pattern 31 is performed so that the lead-free solder 5 is electrically connected to the conductive pattern 31, and then the lead-free solder 5 is mounted on the conductive pattern 31 (FIG. 5H). The above description is about an example in which the conductive pattern 31 is formed by plating, but another method may be used to form the conductive pattern 31.

Figure 5I:
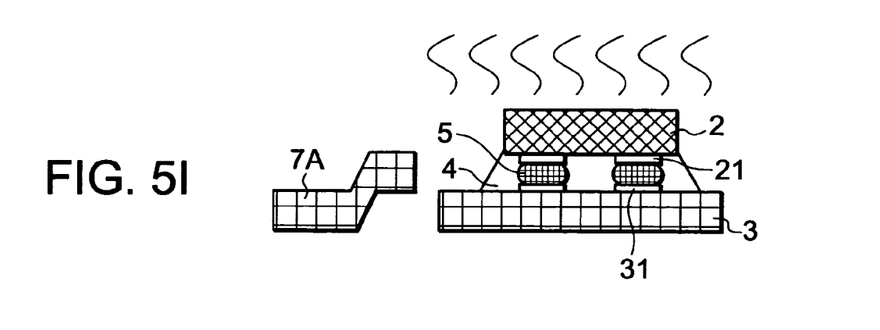
Figure 5J:
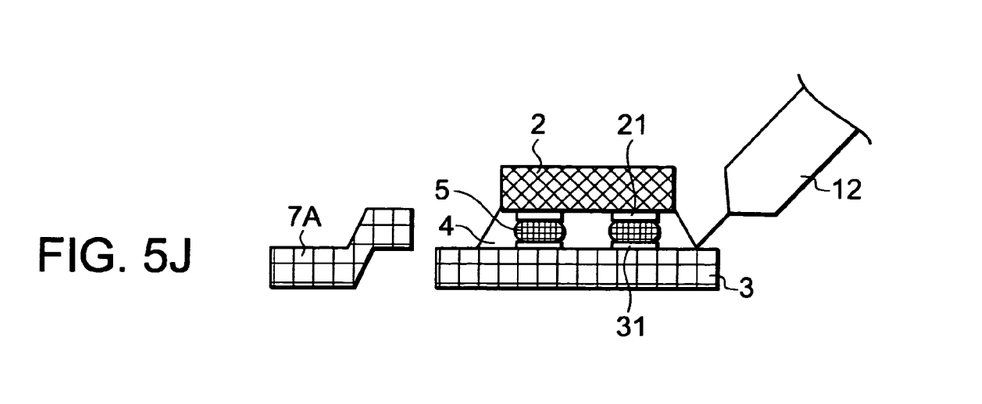

Subsequently, a reflow process is performed (FIG. 5I). Then, after cleansing, the underfill resin 4 is injected by a dispenser nozzle 12 or the like (FIG. 5J), and the underfill resin 4 is hardened under a high-temperature condition using a bake oven (not illustrated) or the like. The semiconductor device 1 is fabricated by the above described steps and the like.

Each of the materials used for the semiconductor device 1 has a unique thermal expansion coefficient. For example, the semiconductor chip 2 is 3 ppm/° C. in thermal expansion coefficient, and the lead frame of the die pad 3 and the like is about 17 ppm/° C. in thermal expansion coefficient. Consequently, the amount of expansion is different between the semiconductor chip 2 and the die pad 3, depending on temperature change of the usage environment or on temperature change during qualification test. Accordingly, in the lead-free solder 5 disposed in a gap between the semiconductor chip 2 and the die pad 3, thermal stress occurs in proportion to the difference of thermal expansion coefficient between the semiconductor chip 2 and the die pad 3 and to Young's modulus of the lead-free solder 5.

Lead-free solder is, for example, five times or more harder than high-melting lead solder. Accordingly, the produced thermal stress increases. Such increase in thermal stress causes cracks in the solder. When cracks occur in the solder, the connection area is reduced, inevitably lowering thermal and electrical characteristics.

The thermal stress occurring between the semiconductor chip 2 and the die pad 3 is smallest at the center C of the opposite region and its vicinity. In other words, this position is stress-free or has a minimum stress. As the distance from the center C of the opposite region is longer, the stress value becomes greater. According to the exemplary embodiment 1, the column-shaped lead-free solder 5 is arranged particularly within the circle 10 drawn around the center C of the opposite region between the semiconductor chip 2 and the die pad 3 and having a diameter corresponding to the narrow side L of the opposite region. As a result, the rate of occurrence of cracks in the lead-free solder 5 can be reduced, allowing provision of a semiconductor device with high reliability.

Further, since the space between the column-shaped lead-free solders 5 is filled with the underfill resin 4, stress in the space between the adjoining lead-free solders 5 and stress in a part external to the circle 10 are absorbed by the underfill resin 4. Accordingly, the reliability of connection between the semiconductor chip 2 and the die pad 3 can be ensured. Also, connection life can be improved.

From the Coffin-Manson formula, it is known that the connection life at a thermal cycle test is proportional to the power of the height of connection. Thus, the thickness of the lead-free solder 5 between the semiconductor chip 2 and the die pad 3 is preferably set greater. According to the exemplary embodiment 1, the height of the column-shaped lead-free solder 5 can be set to a desired value by regulating the amount of solder fed. However, as with the related art such as Patent Document 3, when a method is used which arranges solder over the whole surface, the solder material spills over to a region external to the surface of the die pad 3 and the semiconductor chip 102; thus it is difficult to implement a satisfactory thickness, compared to when the solder spilling region is suppressed by plating or the like to arrange column-shaped solders.

According to the exemplary embodiment 1, a technique is used which shapes the lead-free solder 5 into columns, and also fills the space between the columns with the underfill resin 4 being a filler. Accordingly, when the lead-free solder 5 being hard and fragile is used as a chip mounting material, stress occurring between the semiconductor chip 2 and the die pad 3 being the first conductive frame can be reduced by the underfill resin 4. As a result, it is possible to effectively suppress occurrence of cracks in the lead-free solder 5 and brokerage of the semiconductor chip 2. Further, since the lead-free solder 5 is arranged within the circle 10 drawn around the center C of the opposite region between the semiconductor chip 2 and the die pad 3 and having a diameter corresponding to the narrow side L of the opposite region, it is possible to more effectively prevent occurrence of cracks in the lead-free solder 5 and brokerage of the semiconductor chip 2.

Second Exemplary Embodiment

A semiconductor device fabricating method different from that of the exemplary embodiment 1 will be described below. In the following description, the same reference numerals are applied to parts corresponding to those of the exemplary embodiment 1, and an explanation thereof is appropriately omitted.

A semiconductor device according to the exemplary embodiment 2 is similar to that of the exemplary embodiment 1 in terms of the basic structure and fabrication method other than the following points. That is, a difference between the exemplary embodiment 1 and the exemplary embodiment 2 lies in that, according to the exemplary embodiment 1, the conductive pattern 21 on the surface of the first principal surface 2A is formed by etching the conductive pattern 21 by use of a resist mask, but according to the exemplary embodiment 2, the conductive pattern 21 is formed by a lift-off process. Another difference between exemplary embodiment 1 and the exemplary embodiment 2 lies in that, according to exemplary embodiment 1, the lead-free solder 5 is first formed on the semiconductor chip 2, but according to the exemplary embodiment 2, the lead-free solder 5 is first formed on the die pad 3.

FIGS. 6A to 6D and FIGS. 7E and 7I are substantial sectional views schematically illustrating steps of fabricating the semiconductor device according to the exemplary embodiment 2.

Figure 6A:
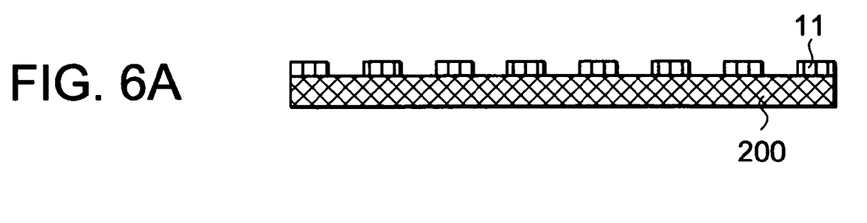
FIGS. 6A to 6D are sectional views illustrating steps of fabricating a semiconductor device according to an exemplary embodiment 2.
Figure 6B:
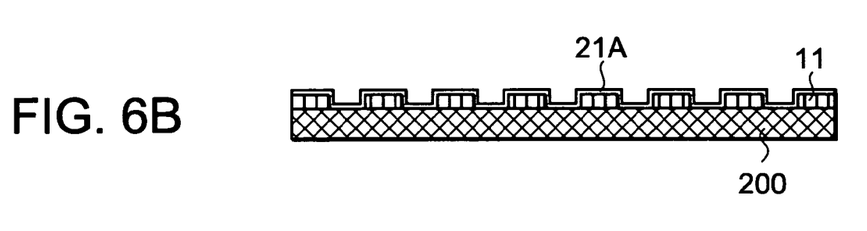

Firstly a wafer 200 is fabricated in which multiple semiconductor chips 2 are formed. Then, a resist film is formed by a spin coating process on a first principal surface 2A of a semiconductor chip 2. Subsequently, a resist pattern 11 is formed by photolithography or the like (FIG. 6A). Subsequently, a metal layer 21A for forming a conductive pattern 21 is formed over the whole surface by sputtering or the like (FIG. 6B).

Figure 6C:
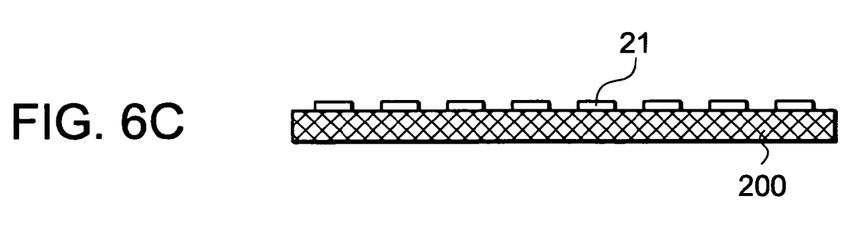
Figure 6D:
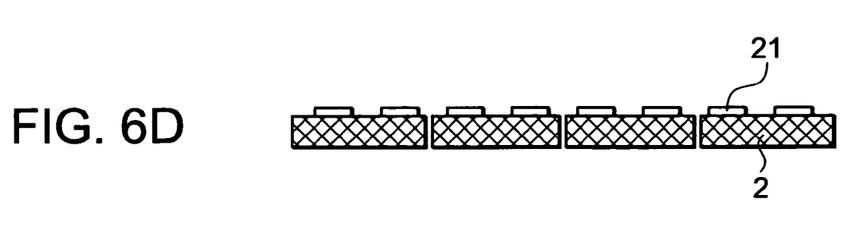

Subsequently, the resist pattern 11 is removed by a lift-off process, whereby that region of the metal layer 21A in which the metal layer 21A and the resist pattern 11 do not constitute a laminate structure remains intact, and the conductive pattern 21 is provided (FIG. 6C). Thereafter, the wafer 200 is separated by dicing so that the size of the semiconductor chip 2 is provided (FIG. 6D).

Figure 7E:
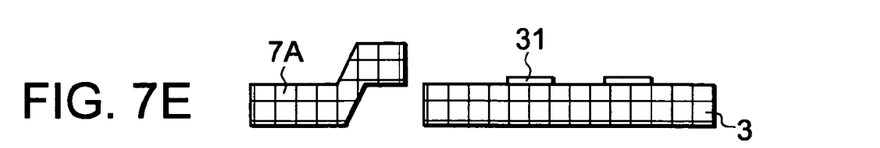
FIGS. 7E to 7I are sectional views illustrating steps of fabricating the semiconductor device according to the exemplary embodiment 2.
Figure 7F:
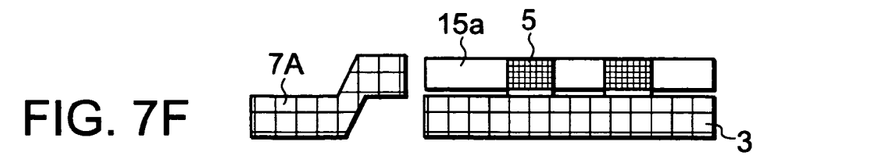
Figure 7G:
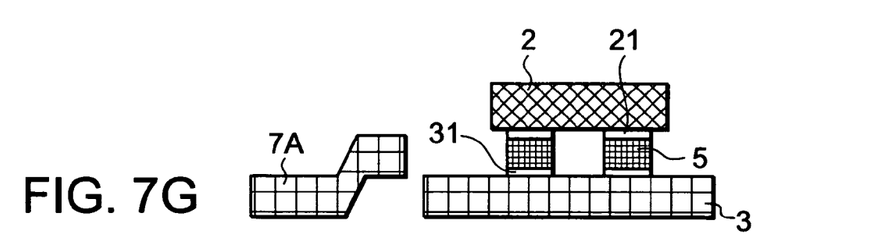

A conductive pattern 31 is preliminarily formed by plating on the surface of the die pad 3 (FIG. 7E). A lead-free solder 5 is fed on the surface of the die pad 3. More specifically, a metal mask 15a preliminarily shaped into a desired pattern is placed on the surface of the die pad 3 opposite from the first principal surface 2A, and a lead-free solder paste is fed to the metal mask 15a and solder printing is performed (FIG. 7F). Thereafter, the semiconductor chip 2 is placed on the die pad 3 so that the conductive pattern 21 formed on the first principal surface 2A of the semiconductor chip 2 is electrically connected to the lead-free solder 5 (FIG. 7G).

Figure 7H:
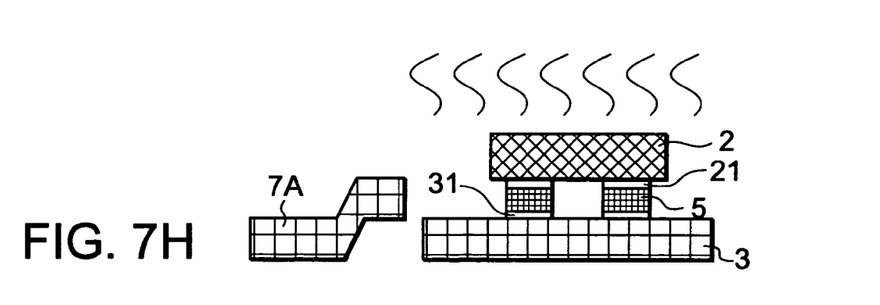
Figure 7I:
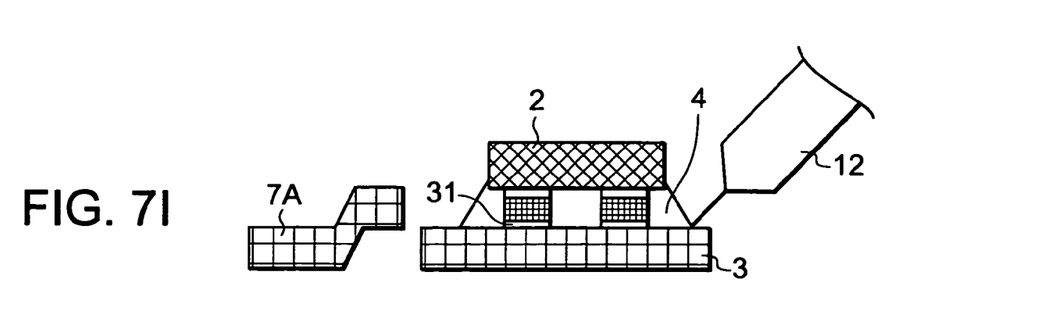

Subsequently, a reflow process is performed (FIG. 7H). Then, after cleansing, an underfill resin 4 is injected by use of a dispenser nozzle 12 or the like (FIG. 7I), and the underfill resin 4 is hardened under a high-temperature condition using a bake oven or the like.

The semiconductor device according to the exemplary embodiment 2 has advantageous effects similar to that of the exemplary embodiment 1. The above described fabrication procedures according to the exemplary embodiments 1 and 2 are exemplary of the present invention, and it will easily be appreciated that another fabrication method may be used in a scope not departing from the object of the present invention.

Third Exemplary Embodiment

An example of semiconductor device having a structure different from those of the exemplary embodiments 1 and 2 will be described below. The semiconductor device according to the exemplary embodiment 3 is similar to that of the exemplary embodiment 1 in terms of the basic structure and fabrication method other than the following points. That is, a difference between the exemplary embodiment 1 and the exemplary embodiment 3 lies in that, according to the exemplary embodiment 1, a column-shaped lead-free solder 5 is arranged within a circle drawn around a center C of the opposite region between the semiconductor chip 2 and the die pad 3 and having a diameter corresponding to a narrow side L of the opposite region, but according to the exemplary embodiment 3, a column-shaped lead-free solder 5 is arranged in a position in which the column-shaped lead-free solder 5 overlaps, in a plan view, a pad (source pad 22A) which is among pads formed on the second principal surface of the semiconductor chip and which is connected to a current path formed between the first principal surface and second principal surface. Further, the difference of the lead-free solder according to the exemplary embodiment 3 from that of the exemplary embodiment 1 lies in that its size is set so that the after-mentioned <formula 1> and <formula 2> are satisfied.

Figure 8:
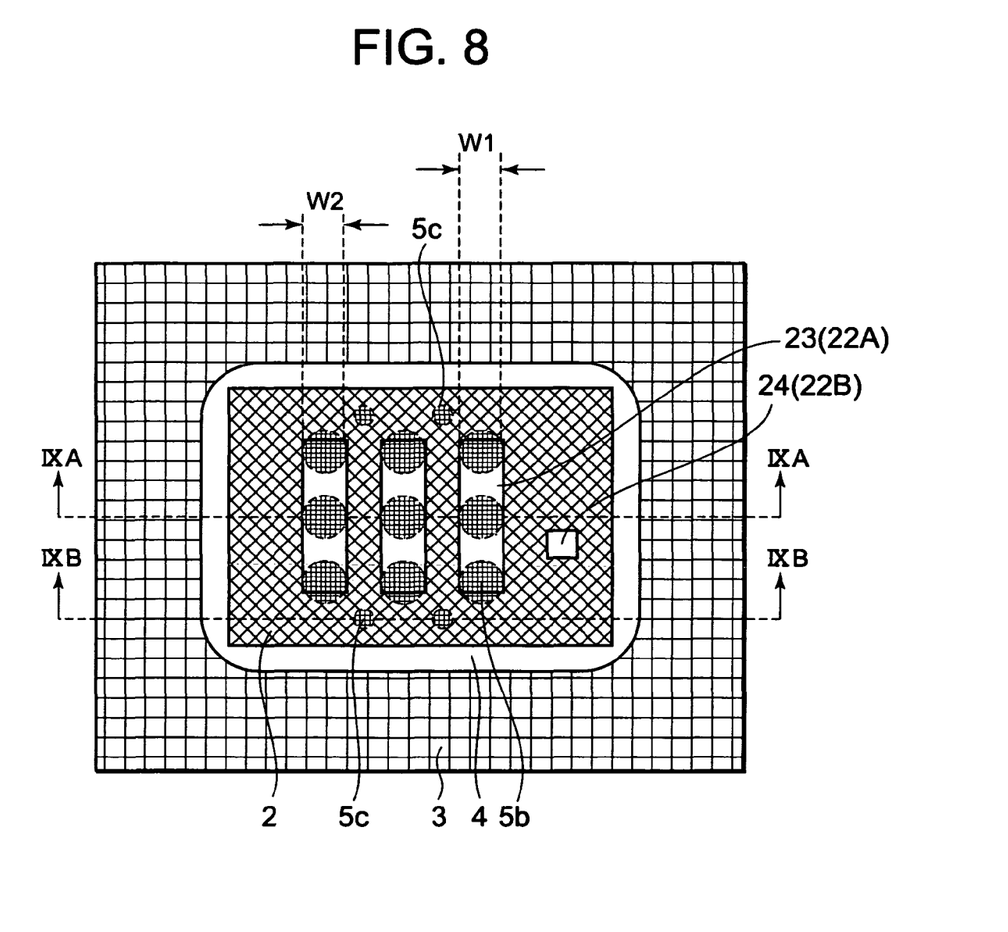
FIG. 8 is a schematic top view for describing a position of arranging lead-free solder according to an exemplary embodiment 3.
Figure 9A:
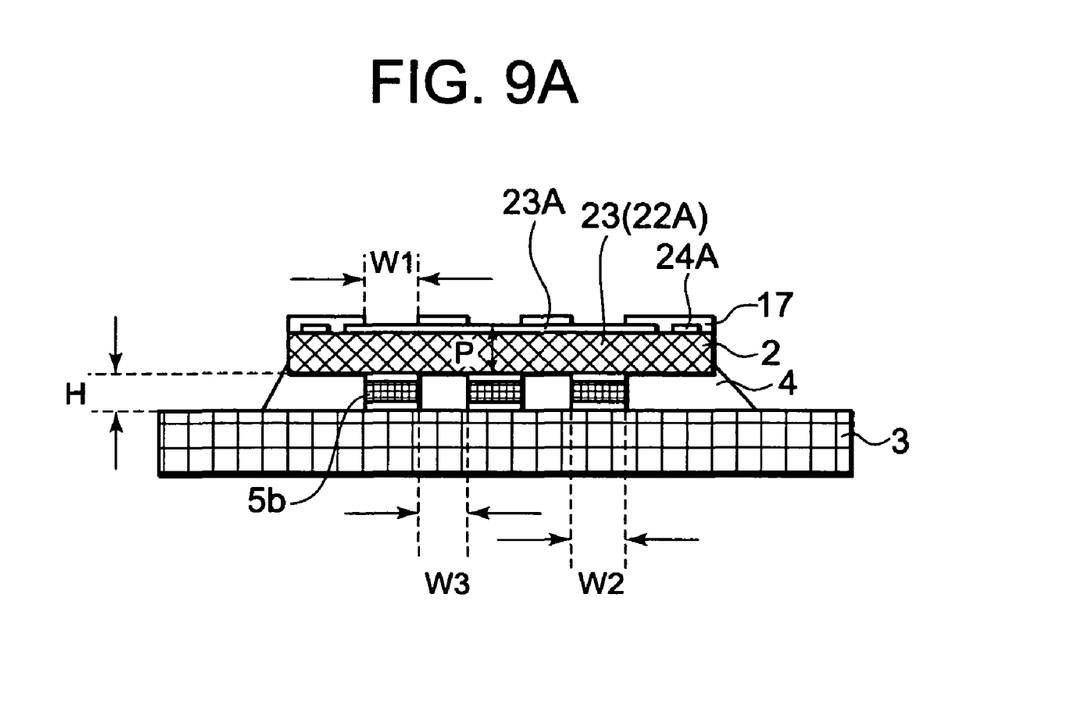
FIG. 9A is a sectional view along the line IXA-IXA of FIG. 8.

FIG. 8 is a schematic top view for describing the shape and the arrangement position of the lead-free solder arranged on the semiconductor chip 2 according to the exemplary embodiment 3. FIG. 9A is a sectional view along the line IXA-IXA of FIG. 8 and FIG. 9B is a sectional view along the line IXB-IXB of FIG. 8.

Figure 9B:
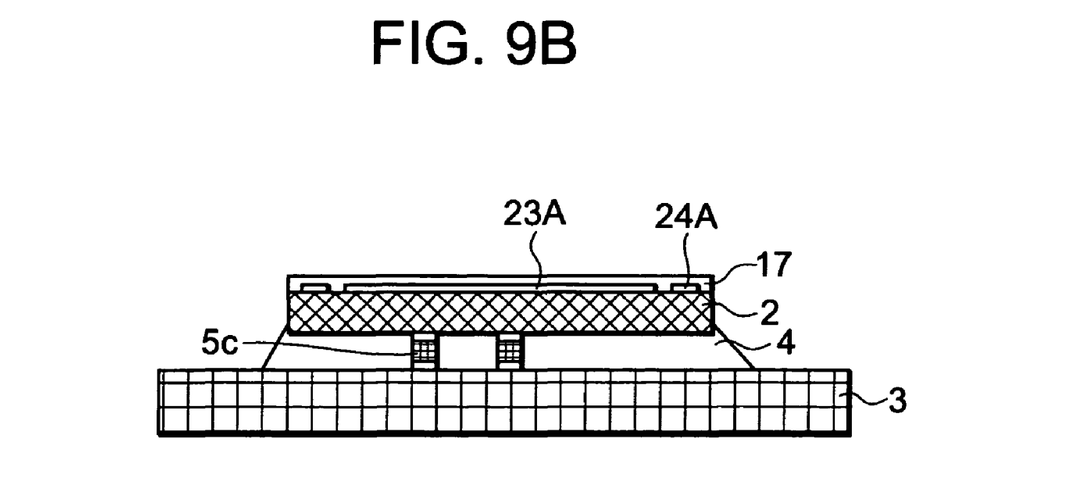
FIG. 9B is a sectional view along the line IXB-IXB of FIG. 8.

As illustrated in FIGS. 9A and 9B, multiple lead-free solders 5b and 5c having a columnar shape are arranged in a gap between the semiconductor chip 2 and the die pad 3 in a manner distant from each other. And the space between the multiple lead-free solders 5b and 5c is filled with an underfill resin 4. The lead-free solder 5b is, as illustrated in FIG. 8, arranged in a position in which the lead-free solder 5b overlaps, in a plan view, a source pad 22A being a source electrode 23 formed on the second principal surface 2B of the semiconductor chip 2. However, the lead-free solder 5c is arranged in a region in which the source pad 22A is not formed.

When the length in a narrow side direction of the source electrode 23 is W1, the minimum length in a direction parallel to W1 of the lead-free solder 5b arranged in a position in which, when the source electrode 23 is seen from above (i.e., in a plan view), the length of the lead-free solder 5b which overlaps the source electrode 23 is W2, the minimum space distance between the adjoining lead-free solders 5b is W3 and the height of the lead-free solder 5b is H, the following <formula 1> and <formula 2> are satisfied.

$$W2 \geq W1 \qquad \text{<Formula 1>}$$

$$W3 \geq H \qquad \text{<Formula 2>}$$

W1 to W3 and H are not particularly limited in a scope not departing from the object of the present invention; for example, W1 may be set to 400 μm, W2 may be set to W1+0 to 20 μm, W3 may be set to 50 to 100 μm and H may be set to 20 to 50 μm.

A source aluminum layer 23A and a gate aluminum layer 24A are formed on the second principal surface 2B of the semiconductor chip 2, and the second principal surface 2B is covered with a protective layer 17 having an opening in a region where the source pad 22A and gate pad 22B are to be arranged. Here, the current path P between the first principal surface 2A and the second principal surface 2B is fed from the source pad 22A being a source electrode 23. Accordingly, the path extending from the source electrode 23 to the first principal surface 2A of the semiconductor chip 2 just below has a current density higher than those of the other paths. Thus, when the source electrode 23 and the column-shaped lead-free solder 5b are arranged in a position in which the source electrode 23 and the column-shaped lead-free solder 5b overlap each other in a plan view, the electrical resistance can be reduced. Here, a lead-free solder 5c may also be arranged in a region in which the source electrode 23 is not formed. Preferably, the relationship of <formula 2> is also satisfied for the lead-free solder 5c.

According to the exemplary embodiment 3, the source electrode 23 and the column-shaped lead-free solder 5b are arranged in a position in which the source electrode 23 and the column-shaped lead-free solder 5b overlaps each other in a plan view, so that the electrical resistance of the current path P is reduced, thus allowing implementation of low on-resistance of the transistor package. However, in order to reduce the electrical resistance, when the column-shaped lead-free solders 5 are arranged too close to each other, it is difficult to fill the underfill resin 4. According to the exemplary embodiment 3, the minimum distance W3 between the column-shaped lead-free solders 5 is set equal to or greater than the height H of the column-shaped lead-free solder 5, so it is possible to effectively prevent forming of a region in which the underfill resin 4 is not filled. As a result, the effect of reducing stress is sufficiently achieved, thus allowing provision of a semiconductor device with high reliability. Also, low on-resistance is implemented, leading to high performance. In the semiconductor device according to the exemplary embodiment 3, since the horizontal to vertical ratio of the semiconductor chip 2 is set greater, greater advantageous effects are achieved.

An aspect may also be appropriately used in which the exemplary embodiment 3 and the exemplary embodiment 1 are combined. That is, the conditions of the exemplary embodiment 3 are satisfied for the column-shaped lead-free solders 5b and 5c, and the lead-free solders are arranged within a circle drawn around a center C of the opposite region between the first principal surface 2A of the semiconductor chip 2 and the die pad 3 and having a diameter corresponding to a narrow side L of the opposite region, whereby a semiconductor device with high reliability can be provided. Here, the number of the lead-free solders 5b and 5c and the arrangement position thereof are exemplary of the present invention and it will easily be appreciated that various modifications are possible.

Fourth Exemplary Embodiment

An example of semiconductor device having a structure different from those of the exemplary embodiments 1 to 3 will be described below. The semiconductor device according to the exemplary embodiment 4 is similar to that of the exemplary embodiment 1 in terms of the basic structure and fabrication method other than the following points. That is, a difference between the exemplary embodiment 1 and the exemplary embodiment 4 lies in that, according to exemplary embodiment 1, the source pad 22A formed on the second principal surface 2B of the semiconductor chip 2 and the source lead 7A being a second conductive frame are connected via the wire 6, but according to the exemplary embodiment 4, the source pad 22A and the source lead 7A are electrically connected via a clip being a second conductive frame and a column-shaped lead-free solder.

Figure 10:
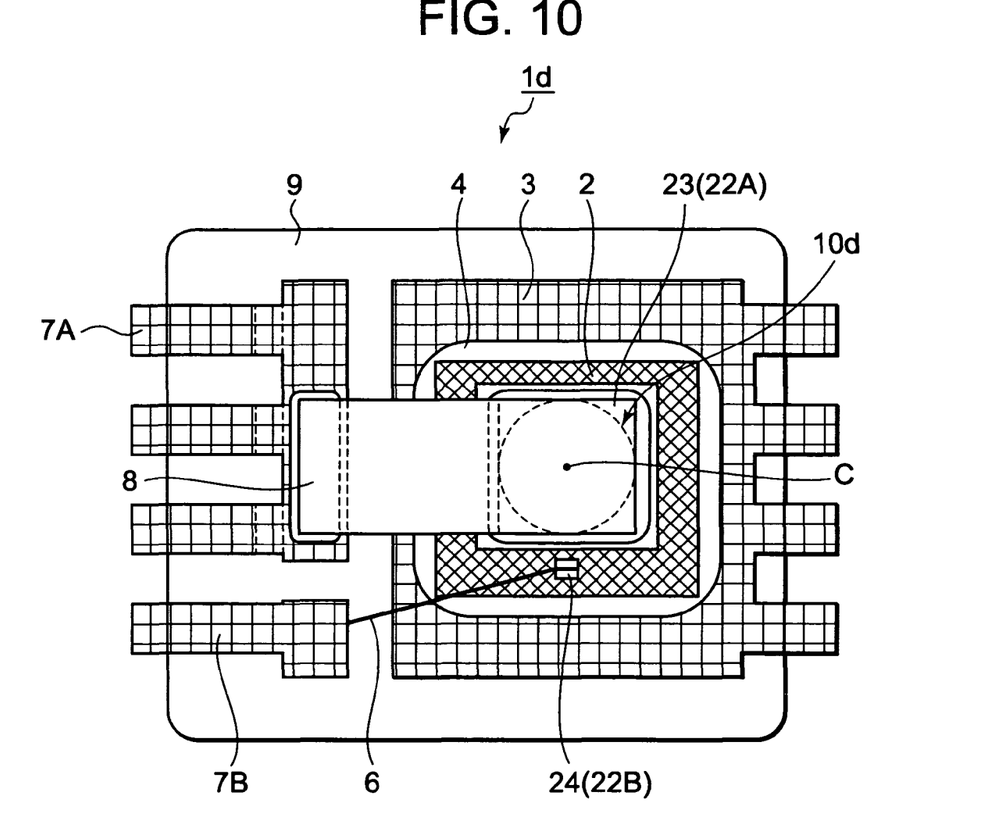
FIG. 10 is a schematic top view of a semiconductor device according to an exemplary embodiment 4.
Figure 11:
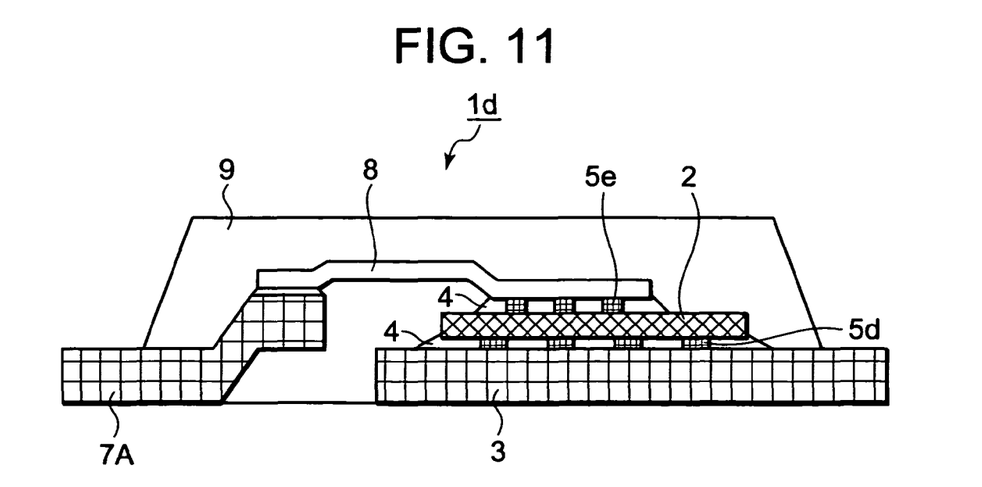
FIG. 11 is a schematic side view of the semiconductor device according to the exemplary embodiment 4.

FIG. 10 is a top view of the semiconductor device according to the exemplary embodiment 4 as seen through the encapsulating resin. FIG. 11 is a schematic side view of the semiconductor device according to the exemplary embodiment 4 as seen through the encapsulating resin. For the convenience of explanation, an illustration of the gate lead 7B and gate wire 6 is omitted, and the position of the source lead 7A, clip 8 and column-shaped lead-free solder 5d is illustrated.

A semiconductor device 1d is a transistor package and includes a semiconductor chip 2, die pad 3 being a first conductive frame, underfill resin 4 being a filler, first lead-free solder 5d, second lead-free solder 5e and gate wire 6 being electrical connection means, clip 8 being a second conductive frame, source lead 7A connected to the clip 8, gate lead 7B which also functions as a second conductive frame, and encapsulating resin 9.

The source electrode 23d of the semiconductor chip 2 is connected via the second column-shaped lead-free solder 5e and clip 8 to the source lead 7A being an external connection terminal. The gate electrode 24 of the semiconductor chip 2 is connected via the gate wire 6 to the gate lead 7B being an external connection terminal. The die pad 3, source lead 7A, a part of the gate lead 7B, and semiconductor chip 2 are, as illustrated in FIGS. 10 and 11, molded with the encapsulating resin 9. Here, the clip 8 and the source lead 7A are electrically connected using lead-free solder, Ag paste or the like.

As illustrated in FIG. 11, multiple first lead-free solders 5d having a columnar shape are arranged in a gap between the semiconductor chip 2 and the die pad 3 in a manner distant from each other. The space between the first lead-free solders 5d is filled with the underfill resin 4. The position of arranging the first lead-free solder 5d is, as with the exemplary embodiment 1, within a circle 10 (refer to FIG. 3) drawn around a center C of the opposite region between the semiconductor chip 2 and the die pad 3 and having a diameter corresponding to a narrow side L of the opposite region.

As illustrated in FIG. 11, multiple second lead-free solders 5e having a columnar shape are arranged in a gap between the semiconductor chip 2 and the clip 8 in a manner distant from each other. The space between the second lead-free solder 5e is filled with the underfill resin 4. The position of arranging the second lead-free solder 5e is, as with the exemplary embodiment 1, within a circle 10d drawn around a center C of the opposite region between the semiconductor chip 2 and the clip 8 and having a diameter corresponding to a narrow side of the opposite region.

The area of connection between the semiconductor chip 2 and the clip 8 is typically smaller than the opposite region between the semiconductor chip 2 and the die pad 3. Consequently, in the surface of connection between the clip 8 and the semiconductor chip, the stress by thermal cycle may not cause any problem. In this case, the second lead-free solder 5e may be arranged off the circle 10d. When a large area is used, the position of arranging the second lead-free solder 5e can be appropriately adjusted depending on applications and required characteristics.

When the first lead-free solder 5d and the second lead-free solder 5e are arranged in a position in which the first lead-free solder 5d and the second lead-free solder 5e overlap each other as seen from above, the direction of current path P between the first principal surface 2A and the second principal surface 2B can substantially agree with the direction of thickness of the semiconductor chip 2. Accordingly, low on-resistance is implemented, thus allowing provision of a semiconductor device with high reliability and excellent characteristics.

With the semiconductor device according to the exemplary embodiments 1 to 4, when lead-free solder having Young's modulus five or so times higher than conventional lead solder is used, the stress produced in the solder during thermal cycle can be reduced, preventing reduction of reliability life caused by damages such as cracks. Accordingly, while environmental burden is reduced by using lead-free solder, a semiconductor device with high reliability is provided. Further, when lead-free solder is selected as an alternative to high-melting lead solder, the range of selecting a solder material can be broadened.

The present invention is not limited to the above described exemplary embodiments, and appropriate modifications to the exemplary embodiments are possible without departing from the object of the invention. The above description is about a case in which MOSFET is used as the semiconductor chip 2, but the present invention can be applied to various types of semiconductor chips without departing from the object of the invention. For example, the present invention can be applied to a semiconductor chip composed of a diode.

Further, it is noted that Applicant's intent is to encompass equivalents of all claim elements, even if amended later during prosecution.

What is claimed is:

1. A semiconductor device, comprising:
 a semiconductor chip including a current path between a first principal surface and a second principal surface opposite from the first principal surface, the semiconductor chip having a rectangular shape defined by a longer side and a shorter side in plan view;
 a first conductive frame electrically connected via a plurality of column-shaped lead-free solders to the first principal surface, each of the plurality of column-shaped lead-free solders being arranged in a gap between the first principal surface and the first conductive frame and within a circle drawn around a center of the semiconductor chip and having diameter corresponding to a length of the shorter side;
 a second conductive frame electrically connected via an electrical connection member to a pad formed on the second principal surface; and
 a filler which is filled in a remaining gap between the first conductive frame, the first principal surface of the semiconductor chip and the plurality of column-shaped lead-free solders.

2. The semiconductor device according to claim 1, wherein the semiconductor chip constitutes at least one of a transistor and a diode.

3. The semiconductor device according to claim 1, wherein a position of arranging the column-shaped lead-free solders is adjusted so that the pad formed on the second principal surface overlaps the column-shaped lead-free solders in a plan view, and
 wherein, when a length in a narrow side direction of the pad is W1, a minimum length in a direction parallel to W1 of a lead-free solder arranged in a position in which the lead-free solder overlaps the pad connected to the current path in a plan view is W2, a minimum space distance between adjoining lead-free solders is W3, and a height of the lead-free solder is H, the following <formula 1> and <formula 2> are satisfied;

$$W2 \geq W1 \qquad \text{<Formula 1<}$$

$$W3 \leq H. \qquad \text{<Formula 2>}$$

4. The semiconductor device according to claim 1, wherein the electrical connection member comprises a wire.

5. The semiconductor device according to claim 1, wherein the electrical connection member comprises a clip and another plurality of column-shaped lead-free solders,
 wherein the clip is electrically connected between the second conductive frame and the another plurality of column-shaped lead-free solders, and the another plurality of column-shaped lead-free solders are further electrically connected to the second principal surface.

6. The semiconductor device according to claim 4, further comprising a third conductive frame electrically connected via another wire to the second principal surface.

7. The semiconductor device, according to claim 5, further comprising a third conductive frame electrically connected via a wire to the second principal surface.

8. The semiconductor device according to claim 5, wherein the another plurality of column-shaped lead-free solders electrically connected to the second principal surface are arranged within a circle drawn around the center of the semiconductor chip and having a diameter corresponding to the length of the shorter side, and a gap between the clip, the second principal surface of the semiconductor chip and the another plurality of the column-shaped lead-free solders is filled with another filler.

9. A semiconductor device, comprising:
a semiconductor chip having rectangular shape defined by a longer side and a shorter side in a plan view and comprising a vertical MOSFET, a drain electrode of the vertical MOSFET being formed on a first principal surface of the semiconductor chip, and a source and a gate electrode of the vertical MOSFET being formed on a second principal surface of the semiconductor chip opposite to the first principal surface;

a die pad with a drain lead made of a first conductive frame, the drain electrode is electrically connected via a plurality of column-shaped lead-free solders to the die pad, each of the plurality of column-shaped lead-fee solders being arranged in a gap between the first principal surface and the first conductive frame and within a circle drawn around a center of the semiconductor chip and having a diameter corresponding to a length of the shorter side;

a source lead made of a second conductive frame and electrically connected via a first electrical connection member to the source electrode;

a gate lead made of a third conductive frame and electrically connected via a second electrical connection member to the gate electrode; and a filler which is filled in a remaining gap between the first conductive frame, the first principal surface of the semiconductor chip and the plurality of column-shaped lead-free solders.

10. The semiconductor device according to claim 9, wherein each of the first and second electrical connection members is formed with a conductive wire.

11. The semiconductor device according to claim 9, wherein the first electrical connection member comprises a clip and another plurality of column-shaped lead-free solders,
the clip is electrically connected between the source lead and the another plurality of column-shaped lead-free solders,
the another plurality of column-shaped lead-fee solders are further electrically connected to the source electrode, and
the second electrical connection member is formed with a conductive wire.

* * * * *